US009148139B2

United States Patent
Bhalla et al.

(10) Patent No.: US 9,148,139 B2
(45) Date of Patent: Sep. 29, 2015

(54) MONOLITHICALLY INTEGRATED CASCODE SWITCHES

(71) Applicant: United Silicone Carbide, Inc., Monmouth Junction, NJ (US)

(72) Inventors: Anup Bhalla, Princeton Junction, NJ (US); Zhongda Li, Somerset, NJ (US)

(73) Assignee: United Silicon Carbide, Inc., Monmouth Junction, NJ (US)

( * ) Notice: Subject to any disclaimer, the term of this patent is extended or adjusted under 35 U.S.C. 154(b) by 0 days.

(21) Appl. No.: 14/450,660

(22) Filed: Aug. 4, 2014

(65) Prior Publication Data

US 2015/0200662 A1 Jul. 16, 2015

Related U.S. Application Data

(60) Provisional application No. 61/926,455, filed on Jan. 13, 2014.

(51) Int. Cl.
| | | |
|---|---|---|
| *H01L 29/80* | (2006.01) | |
| *H03K 17/687* | (2006.01) | |
| *H01L 21/768* | (2006.01) | |
| *H01L 21/8234* | (2006.01) | |
| *H01L 23/535* | (2006.01) | |
| *H01L 27/06* | (2006.01) | |
| *H01L 29/78* | (2006.01) | |
| *H01L 29/808* | (2006.01) | |
| *H01L 21/82* | (2006.01) | |
| *H01L 27/088* | (2006.01) | |
| *H01L 27/098* | (2006.01) | |

(52) U.S. Cl.
CPC ........ *H03K 17/687* (2013.01); *H01L 21/76897* (2013.01); *H01L 21/8213* (2013.01); *H01L 21/823475* (2013.01); *H01L 23/535* (2013.01); *H01L 27/0617* (2013.01); *H01L 27/088* (2013.01); *H01L 27/098* (2013.01); *H01L 29/78* (2013.01); *H01L 29/808* (2013.01)

(58) Field of Classification Search
CPC . H01L 29/8083; H01L 29/868; H01L 29/872; H01L 29/36; H01L 29/66068; H01L 29/1066; H01L 29/6606; H01L 29/1608
See application file for complete search history.

(56) References Cited

U.S. PATENT DOCUMENTS

| | | | |
|---|---|---|---|
| 4,663,547 A | 5/1987 | Adler et al. | |
| 4,945,266 A | 7/1990 | Mori | |
| 5,014,102 A | 5/1991 | Adler | |

(Continued)

FOREIGN PATENT DOCUMENTS

| | | |
|---|---|---|
| JP | 2002/231820 | 8/2002 |
| JP | 2004/327891 | 11/2004 |
| WO | WO 00/19536 | 4/2000 |

*Primary Examiner* — Roy Potter
*Assistant Examiner* — Paul Patton
(74) *Attorney, Agent, or Firm* — Baker & Hostetler LLP

(57) ABSTRACT

Disclosed inventions are directed to advanced high-voltage switches with improved performance characteristics, increased reliability, and better compatibility with conventional gate drivers. The inventions disclosed herein implement a hybrid switch, comprising a high-voltage normally-on SiC VJFET, controlled via a low-voltage Si MOSFET in a cascode (Baliga-pair) configuration. The SiC VJFET and Si MOSFET are integrated monolithically at a wafer level, with the Si MOSFET fabricated on the Si layer that is directly adjacent to a dielectric layer on top of the SiC VJFET. Methods of making and operating these switches are also provided.

16 Claims, 15 Drawing Sheets

(56) References Cited

U.S. PATENT DOCUMENTS

| | | |
|---|---|---|
| 5,396,085 A | 3/1995 | Baliga |
| 7,719,055 B1 | 5/2010 | McNutt et al. |
| 2005/0067630 A1 | 3/2005 | Zhao |
| 2006/0011924 A1 | 1/2006 | Mazzola et al. |
| 2009/0134434 A1 | 5/2009 | Werner |
| 2010/0297810 A1 | 11/2010 | Otremba et al. |
| 2010/0320476 A1 | 12/2010 | Cheng et al. |
| 2011/0199148 A1 | 8/2011 | Iwamura |
| 2012/0199875 A1 | 8/2012 | Bhalla et al. |
| 2014/0027785 A1* | 1/2014 | Rose .............................. 257/77 |

* cited by examiner

MONOLITHICALLY INTEGRATED CASCODE SWITCHES

CROSS-REFERENCE TO RELATED APPLICATIONS

This application claims the benefit of priority to U.S. Provisional Application 61/926,455, "Monolithically Integrated Cascode Switches Cascode Switches", filed Jan. 13, 2014. The entirety of which is incorporated by reference herein for all purposes.

FIELD OF THE INVENTION

The present invention relates to the field of power semiconductor transistors and power ICs, consisting of silicon carbide (SiC) high-voltage vertical junction field-effect transistors (VJFETs), and the methods of making the same.

BACKGROUND OF THE INVENTION

High-voltage normally-on SiC VJFETs offer higher efficiency than silicon transistors due to the inherent material advantages of SiC. Compared with the SiC metal-oxide-semiconductor field-effect transistors (MOSFETs), SiC VJFETs are also more reliable due to the absence of the SiC metal-oxide-semiconductor (MOS) interface, which is of much inferior quality compared with Si MOS interface, and is known to cause problems such as threshold voltage shifting. FIG. 1A depicts applications where normally-off operation mode is preferred, wherein a high-voltage normally-on SiC JFET 104 can be connected with a low-voltage normally-off silicon (Si) MOSFET 105 in a cascode configuration, forming a cascode switch 112 that is normally-off.

FIG. 1A illustrates a schematic diagram of such a prior art cascode switch 112. The source 108 of the high-voltage SiC JFET 104 is connected to the drain 105 of the low-voltage Si MOSFET 105. Further, the gate 106 of the high-voltage SiC JFET 104 is connected to the source 111 of the low-voltage Si MOSFET 105. The drain 107 of the SiC JFET 104 becomes the drain 102 of the cascode switch 112, and the source 111 of the Si MOSFET 105 becomes the source 103 of the cascode switch 112. In the on-state, a biasing voltage needs to be applied to the gate 101 of the cascode switch to turn on the Si MOSFET 105, in order to turn on the whole cascode switch 112. In the off-state, when applying an increasing voltage to the drain 102 of the cascode switch 112, keeping the source 103 and gate 101 of the cascode switch 112 shorted, initially the source 108 voltage of the SiC JFET 104 will rise until it reaches the threshold voltage of the SiC JFET 104, at which point the voltage difference between the gate 106 and the source 108 of the SiC JFET 104 turns the JFET 104 off. As a result, the low-voltage Si MOSFET 105 only supports the threshold voltage of the SiC JFET 104, and the rest of the voltage that is applied between the drain 102 and the source 103 of the cascode switch 112 is supported by the high-voltage SiC JFET 104.

The prior art of the aforementioned cascode switch integrates the high-voltage normally-on switch with the low-voltage normally-off switch at the package level. FIG. 1B illustrates an example of the prior art where the cascode switch 113 is assembled using die stacking The low-voltage Si MOSFET die, consisting of the Si chip 120, the drain electrode 119, the source electrode 121, and the gate electrode 122, sits directly on top of the SiC JFET die, consisting of the SiC chip 116, the drain electrode 115, the source electrode 118, and the gate electrode 117. The source 118 of the SiC JFET and the drain 119 of the Si MOSFET is connected by direct contact of the two dies. But the gate electrode 117 of the SiC JFET has to be connected to the source electrode 121 of the Si MOSFET using external connection 113. The conducting lead frame 114 on which the stacked dies sit serves as the drain of the cascode switch 113. The gate 122 of the Si MOSFET serves as the gate of the cascode switch 113, and the source 121 of the Si MOSFET as the source. The cascode switch assembled at the package level requires complicated assembly procedures, which increases manufacturing cost and reduces reliability. It also introduces high undesirable parasitic inductance, capacitance and resistance, which can cause slow switching, reduced efficiency, and ringing during switching transients.

The invention described herein integrates the SiC JFET with the Si MOSFET into the monolithically integrated cascode switch at the wafer level. This invention simplifies the assembly compared with the die stacking prior art and reduces parasitic components at the same time. Further, Si-IC smart features can be built monolithically into the cascode structure to add functionalities such as switching speed control, short circuit turn-off, dynamic overcurrent limiting. The gate driver for the SiC VJFET can also built monolithically using the integrated Si.

SUMMARY OF THE INVENTION

The inventions disclosed herein are directed to advanced high-voltage switches with improved performance characteristics, increased reliability, and better compatibility with conventional gate drivers. The inventions disclosed herein implement a hybrid switch, comprising a high-voltage normally-on SiC VJFET, controlled via a low-voltage Si MOSFET in a cascode (Baliga-pair) configuration. The SiC VJFET and Si MOSFET are integrated monolithically at a wafer level, with the Si MOSFET fabricated on the Si layer that is directly adjacent to a dielectric layer on top of the SiC VJFET.

Accordingly, disclosed herein are integrated cascode devices, comprising: a junction gate field-effect transistor (JFET), the JFET comprising: a JFET drain contact extending along a first plane, the first plane extending along a first direction, a JFET gate contact extending along the first plane, the JFET gate disposed above the JFET drain contact along a second direction, the second direction being perpendicular to the first direction, a JFET source contact disposed above the JFET drain contact along the second direction, the JFET source extending along the first plane; a metal-oxide-semiconductor (MOS), the MOS comprising: a MOS drain contact extending along the first plane, the MOS drain contact disposed above the JFET source contact along the second direction, and a MOS source contact extending along the first plane, the MOS source contact disposed above the MOS drain contact along the second direction; and a first conductive via, the entirety of the conductive via having a first common centerline extending in the second direction, the conductive via electrically connecting the JFET source contact to the MOS drain contact. As a frame of reference, the term "first direction" can be envisioned as horizontal in the plane of the paper (or display), the term "second direction" can be envisioned as vertically up in the plane of the paper (or display), and the term "first plane" refers to the plane of the paper (or display).

In a first embodiment, the gate contact of the SiC VJFET is at the bottom of the trench within each cell, and a conductive via shorts the source contact of the SiC VJFET with the drain contact of the Si MOSFET inside the cell. A separate conductive via shorts the gate contact of the SiC VJFET with the source contact of the Si MOSFET outside the cell, to complete the cascode switch.

In a second embodiment, the gate contact of the SiC VJFET is at the same level as its source contact within each cell. A conductive via shorts the source contact of the SiC VJFET with the drain contact of the Si MOSFET inside the cell. A second conductive via shorts the gate contact of the SiC VJFET with the source contact of the Si MOSFET inside the cell, to complete the cascode switch.

Also disclosed herein are methods of manufacturing an integrated cascode device, the method comprising: forming a junction gate field-effect transistor (JFET), the JFET comprising a JFET drain contact, a JFET gate contact and a JFET source contact, each of which extending along a first plane, the first plane extending along a first direction, forming a metal-oxide-semiconductor field effect transistor (MOSFET), the MOSFET comprising a drain contact and a source contact, each of which extends along the first plane, forming a monolithic JFET and MOS device by affixing the JFET to the MOS such that: the JFET gate contact is disposed above the JFET drain contact along a second direction, the second direction being perpendicular to the first direction, the JFET source contact is disposed above the JFET drain contact along the second direction, the JFET source extending along the first plane, the MOS drain contact extends along the first plane, the MOS drain contact being disposed above the JFET source contact along the second direction, and the MOS source contact extending along the first plane, the MOS source contact being disposed above the MOS drain contact; and forming a first conductive via in the monolithic device, wherein the entirety of the conductive via has a first common centerline extending in the second direction, the conductive via electrically connecting the JFET source contact to the MOS drain contact.

One embodiment of the method of making cascode switches includes bonding the Si wafer onto the SiC VJFET wafer using oxide-oxide bonding, followed by Smart Cut to form the SOI structure. The Si MOSFET is then fabricated after the bonding using processes below 800° C. After the fabrication of the Si MOSFET, the substrate of the SiC VJFET wafer is ground to its final thickness, on which Ohmic contact is then formed using laser annealing techniques.

Another embodiment of the method of making cascode switches includes first depositing polysilicon on the dielectric layer on top of the SiC VJFET wafer, followed by laser annealing to recrystallize the polysilicon. The Si MOSFET is then fabricated on the recrystallized polysilicon layer using processes below 800° C. After the fabrication of the Si MOSFET, the substrate of the SiC VJFET wafer is ground to its final thickness, on which Ohmic contact is then formed using laser annealing techniques.

The general description and the following detailed description are exemplary and explanatory only and are not restrictive of the invention, as defined in the appended claims. Other aspects of the present invention will be apparent to those skilled in the art in view of the detailed description of the invention as provided herein.

BRIEF DESCRIPTION OF THE DRAWINGS

The summary, as well as the following detailed description, is further understood when read in conjunction with the appended drawings. For the purpose of illustrating the invention, there are shown in the drawings exemplary embodiments of the invention; however, the invention is not limited to the specific methods, compositions, and devices disclosed. In addition, the drawings are not necessarily drawn to scale. In the drawings.

DETAILED DESCRIPTION OF ILLUSTRATIVE EMBODIMENTS

Figure 1A:
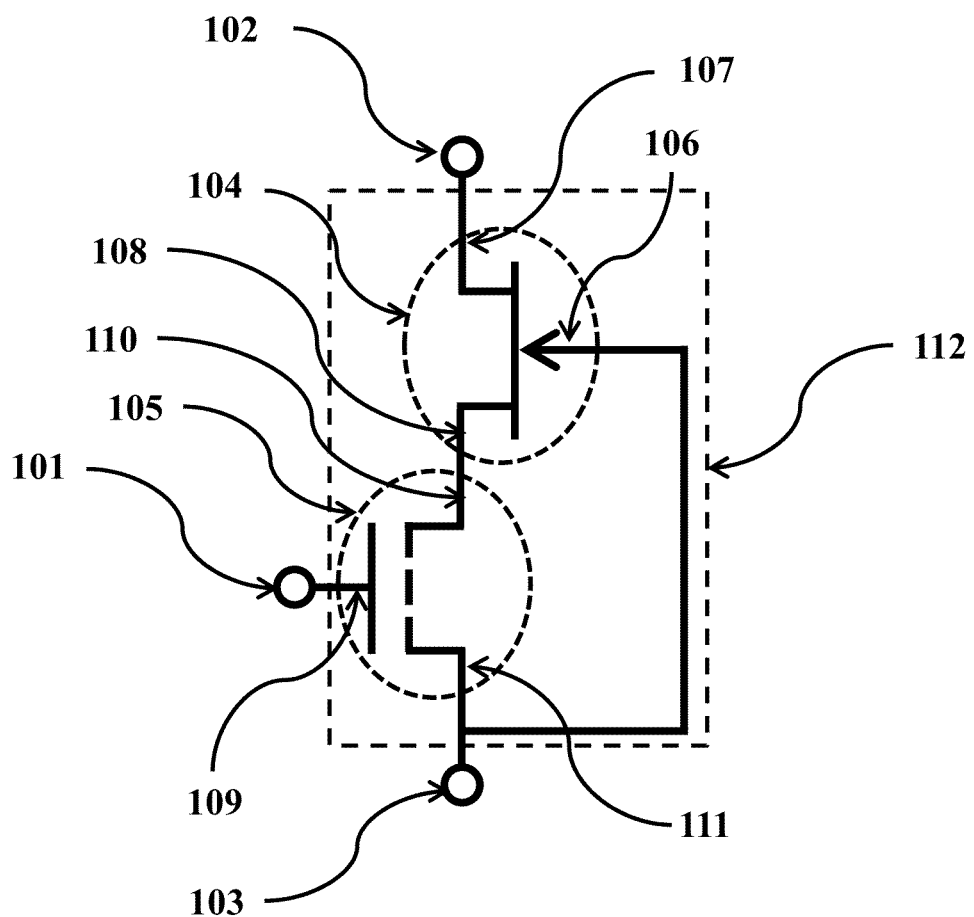
FIG. 1A illustrates a circuit schematic diagram of a prior art cascode switch, consisting of a high-voltage normally-on switch connected in series with a low-voltage normally-off switch.
Figure 1B:
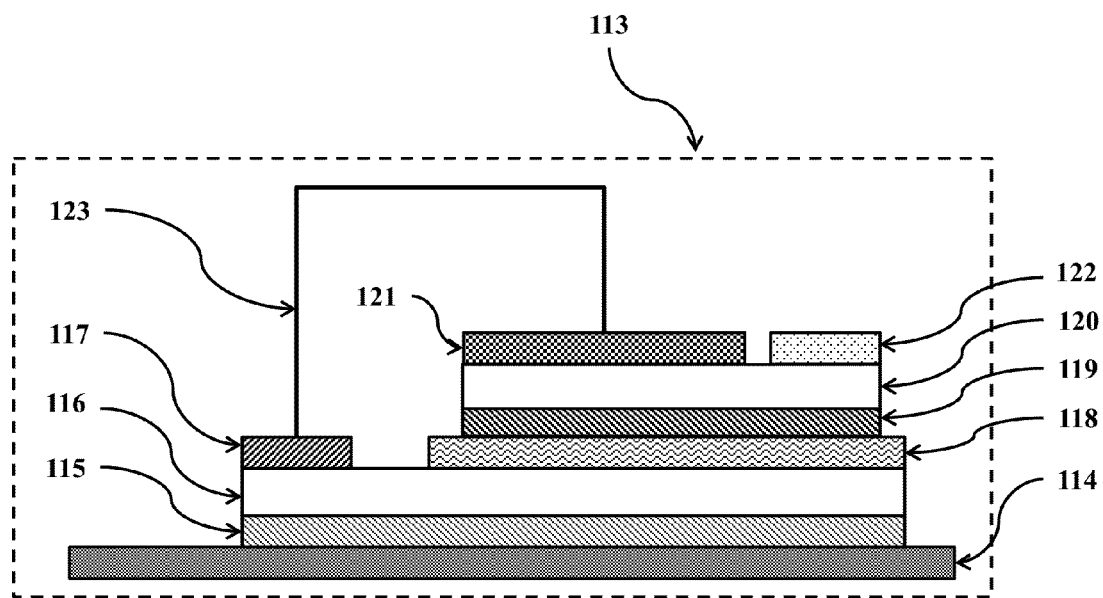
FIG. 1B illustrates an example of the prior art of the cascode switch assembled at the package level using a die stacking method.

The present invention may be understood more readily by reference to the following detailed description taken in connection with the accompanying figures and examples, which form a part of this disclosure. It is to be understood that this invention is not limited to the specific devices, methods, applications, conditions or parameters described and/or shown herein, and that the terminology used herein is for the purpose of describing particular embodiments by way of example only and is not intended to be limiting of the claimed invention. Also, as used in the specification including the appended claims, the singular forms "a," "an," and "the" include the plural, and reference to a particular numerical value includes at least that particular value, unless the context clearly dictates otherwise. The term "plurality", as used herein, means more than one. When a range of values is expressed, another embodiment includes from the one particular value and/or to the other particular value. Similarly, when values are expressed as approximations, by use of the antecedent "about," it will be understood that the particular value forms another embodiment. All ranges are inclusive and combinable.

It is to be appreciated that certain features of the invention which are, for clarity, described herein in the context of separate embodiments, may also be provided in combination in a single embodiment. Conversely, various features of the invention that are, for brevity, described in the context of a single embodiment, may also be provided separately or in any subcombination. Further, reference to values stated in ranges include each and every value within that range.

Throughout this specification reference is occasionally made to one or more layers or elements being "on top of" another layer or element. It should be apparent that such references may be relative to one another and are not to be taken literally in an absolute sense. For example, if a disclosed device is described as having one layer on top of a second layer, it should be readily apparent that such a device may be turned around or upside down without changing the meaning or functional nature of said layers. Oftentimes, the phrase "on top of" in this regard can also mean "directly adjacent to".

In general, suitable integrated cascode devices include a junction gate field-effect transistor (JFET), a metal-oxide-semiconductor (MOS), and a first conductive via, the entirety of the conductive via having a first common centerline extending in the second direction, the conductive via electrically connecting the JFET source contact to the MOS drain contact.

Suitable JFETs used in the integrated cascode devices typically include a JFET drain contact extending along a first plane, the first plane extending along a first direction, and a JFET gate contact extending along the first plane. The JFET gate is typically disposed above the JFET drain contact along a second direction, the second direction being perpendicular to the first direction. A JFET source contact is suitably disposed above the JFET drain contact along the second direction, with the JFET source extending along the first plane.

Suitable metal-oxide-semiconductors (MOSs) include a MOS drain contact extending along the first plane, the MOS drain contact disposed above the JFET source contact along the second direction, and a MOS source contact extending along the first plane, the MOS source contact disposed above the MOS drain contact along the second direction. As mentioned earlier, the entirety of the conductive via has a first common centerline extending in the second direction, the conductive via electrically connecting the JFET source contact to the MOS drain contact.

In additional embodiments, integrated cascode devices may further comprise a second conductive via, the entirety of the second conductive via having a second common centerline extending in the second direction, the conductive via electrically connecting the JFET gate contact to the MOS source contact. Additionally, the first conductive via and the second conductive via may be located in a common JFET cell. Alternatively, the first conductive via can be located in a first JFET cell and the first JFET cell is devoid of another conductive via.

Other variations exist as well. For example, the JFET gate contact and the JFET source contact can be located at the same distance above the JFET drain contact along the first direction. As well, the JFET gate contact can be located in between the JFET source contact and the JFET drain contact along the second direction. These and other variations will be apparent to the skilled artisan in view of the disclosure provided herein.

Suitable methods of manufacturing the integrated cascode devices are also provided. These methods include the basic steps of forming a junction gate field-effect transistor (JFET), forming a metal-oxide-semiconductor field effect transistor (MOSFET), forming a monolithic JFET and MOS device by affixing the JFET to the MOS, and forming a first conductive via in the monolithic device, wherein the entirety of the conductive via has a first common centerline extending in the second direction, the conductive via electrically connecting the JFET source contact to the MOS drain contact.

During the step of forming the junction gate field-effect transistor (JFET), the JFET typically comprises a JFET drain contact, a JFET gate contact and a JFET source contact, each of which extending along a first plane, the first plane extending along a first direction.

During the step of forming the metal-oxide-semiconductor field effect transistor (MOSFET), the MOSFET typically comprises a drain contact and a source contact, each of which extends along the first plane.

During the step of forming the monolithic JFET and MOS device by affixing the JFET to the MOS, the JFET gate contact is suitably disposed above the JFET drain contact along a second direction, the second direction being perpendicular to the first direction. As well, the JFET source contact is suitably disposed above the JFET drain contact along the second direction, the JFET source extending along the first plane. Also, the MOS drain contact typically extends along the first plane, the MOS drain contact being disposed above the JFET source contact along the second direction. And finally the MOS source contact typically extends along the first plane, the MOS source contact being disposed above the MOS drain contact.

When forming a first conductive via in the monolithic device, the entirety of the conductive via has a first common centerline extending in the second direction so that the conductive via electrically connects the JFET source contact to the MOS drain contact.

Suitable methods of manufacturing the integrated cascode devices may include a number of process variations too. For example, the JFET may further comprise a first oxide layer extending along the first plane, wherein the MOS further comprises a second oxide layer extending along the first plane, and wherein affixing the JFET to the MOS includes bonding the first oxide layer to the second oxide layer. In other embodiments, suitable JFETs may further include a first oxide layer extending along the first plane, wherein prior to the step of forming a monolithic JFET and MOS device, depositing a polysilicon film on the first oxide layer, and wherein affixing the JFET to the MOS comprises melting and then recrystallizing the polysilicon via a laser.

Suitable methods of manufacturing the integrated cascode devices may also include forming a second conductive via, wherein the entirety of the second conductive via has a second common centerline extending in the second direction, the conductive via electrically connecting the JFET gate contact to the MOS source contact. Alternatively, the first conductive via and the second conductive via are be formed in a common JFET cell, or the first conductive via is located in a first JFET cell and the first JFET cell is devoid of another conductive via.

Suitable methods of manufacturing the integrated cascode devices may also include the JFET gate contact and the JFET source contact being located at the same distance above the JFET drain contact along the second direction. Alternatively, the JFET gate contact can be located in between the JFET source contact and the JFET drain contact along the second direction.

Figure 2A:
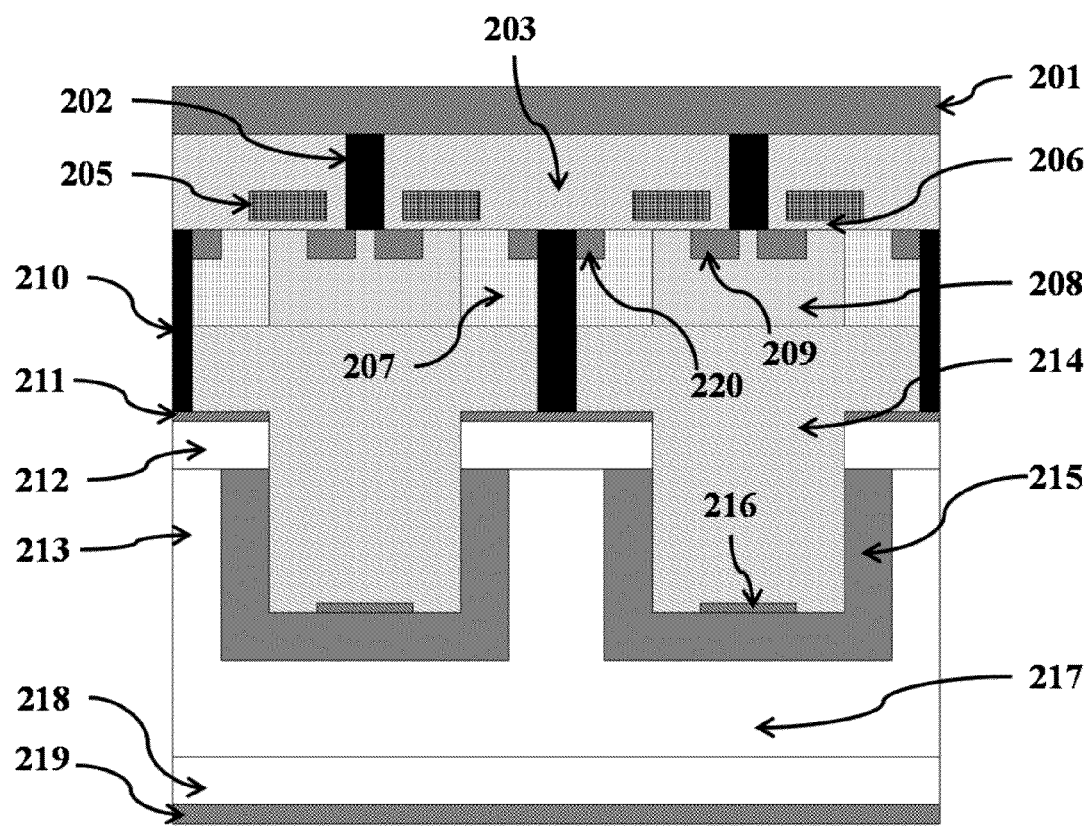
FIG. 2A illustrates the schematic cross-section views of the first embodiment of the monolithically integrated cascode switches, wherein the gate contact is below the source contact inside each cell of the high-voltage normally-on SiC VJFET.

FIG. 2A illustrates the schematic cross-section views of the first embodiment of the monolithically integrated cascode switch, wherein the gate contact 216 is below the source contact 211 inside each cell of the high-voltage normally-on SiC VJFET. The SiC VJFET consists of backside metal 219 that is in contact with the heavily doped n type substrate 218 as the drain contact. N type SiC is on top of the substrate as the drift 217 and channel 213 of the VJFET. The VJFET cells consist of trenches. The bottom and the sidewalls of the trenches are doped to be p type, which is the gate region 215. The VJFET gate contact 216 is at the bottom of the trench in each cell, and is in contact with the gate region 215. The source region 212 is heavily doped n type. VJFET source contact 211 is on top of the source region 212. The trenches are filled with dielectric 214, such as $SiO_2$. The silicon MOSFET sits on top of the planar surface of the dielectric 214. The drain region 220 of the Si MOSFET is doped heavily with n type, and is connected to the source contact 211 of the VJFET through the tungsten via 210. The drift region 207 of the Si MOSFET is doped with n type. The body region 208 of the Si MOSFET is doped with p type. The source region 209 is heavily doped with n type. The polysilicon gate 205 of the Si MOSFET is above the MOS channel 206. The source contact 201 of the Si MOSFET sits on top of the interlayer dielectric 203, and is in contact with the source region 209 through the tungsten via 202. A separate deep via shorts the gate contact 216 of the JFET to the source contact 211 of the Si MOSFET in the locations outside the cell, which is not illustrated in FIG. 2A. In the actual layout, the polysilicon gate 205 of the Si MOSFET runs orthogonally to the gate contact 216 of the SiC VJFET, so that different cell pitches can be used for the Si MOSFET and the SiC VJFET.

Figure 2B:
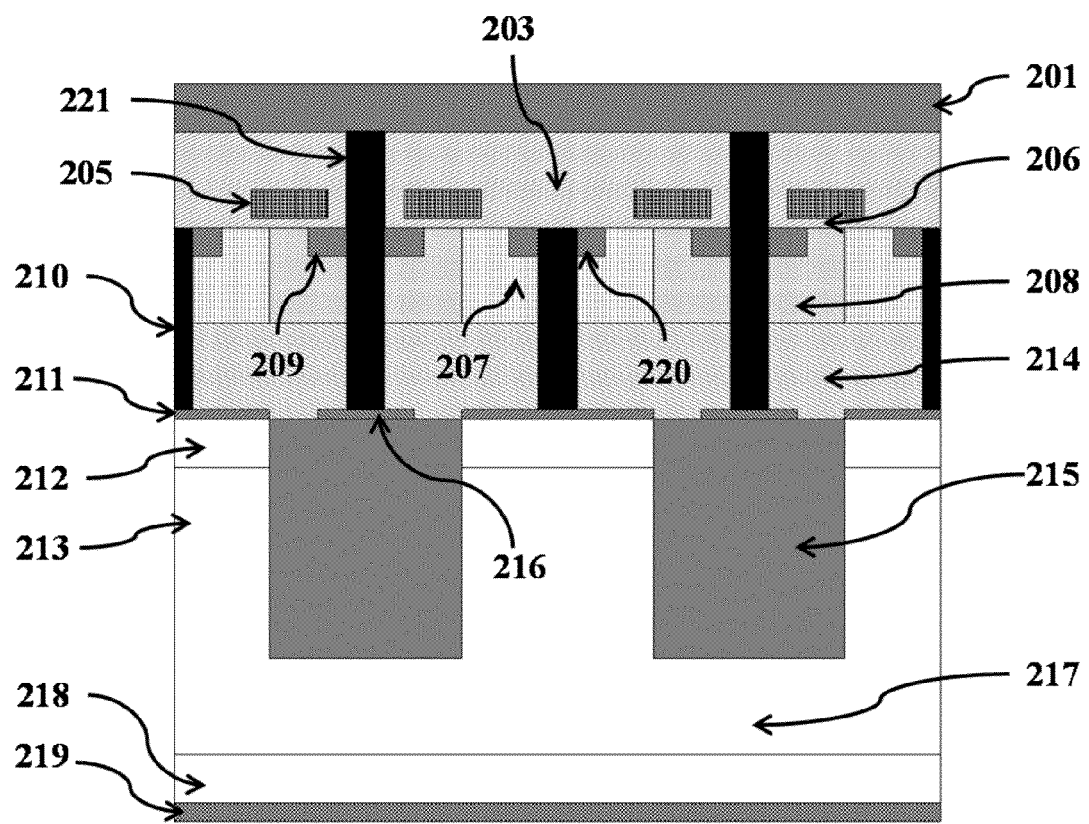
FIG. 2B illustrates the schematic cross-section views of the second embodiment of the monolithically integrated cascode switches, wherein the gate contact is in the same plane as the source contact inside each cell of the high-voltage normally-on SiC VJFET.

FIG. 2B illustrates the schematic cross-section views of the second embodiment of the monolithically integrated cascode switches, wherein the gate contact 216 is in the same plane as the source contact 211 inside each cell of the high-voltage normally-on SiC VJFET. Similar to the SiC VJFET in the first embodiment, the SiC VJFET in the second embodiment also consists of backside metal 219, heavily doped n type substrate 218, N type SiC drift region 217 and channel region 213, heavily doped n type source region 212, and the source contact 211. However, there is no trench in the VJFET cell, and the entirety of the gate region 215 is SiC of p type. As a result, the gate contact 216 is in the same plane as the source contact 211 inside the VJFET cell. Planar dielectric 214 is on top of the SiC VJFET, and the Si MOSFET sits on top of the dielectric 214. Similar to the first embodiment, the drain region 220 of the Si MOSFET is doped heavily with n type, and is connected to the source contact 211 of the VJFET through the tungsten via 210. The drift region 207 of the Si MOSFET is doped with n type. The body region 208 of the Si MOSFET is doped with p type. The source region 209 is heavily doped with n type. The gate electrode 205 of the Si MOSFET sits on top of the gate oxide 206. The source contact 201 of the Si MOSFET sits on top of the interlayer dielectric 203. The tungsten via 221 connects the Si MOSFET source contact 201 and the source region 209 with the gate contact 216 of the SiC VJFET within the cell. In this embodiment, there is no need for a separate via outside the cell to short the source of the MOSFET and the gate of the VJFET. In the actual layout, the polysilicon gate 205 of the Si MOSFET runs orthogonally to the gate contact 216 of the SiC VJFET, so that different cell pitches can be used for the Si MOSFET and the SiC VJFET.

Figure 3A:
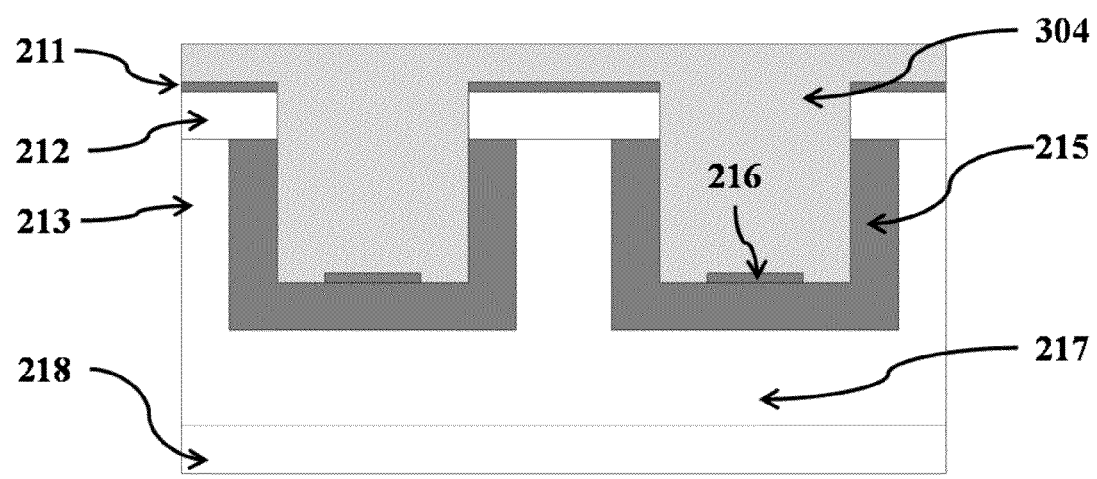
FIG. 3A illustrates the schematic cross-section views of the partially fabricated SiC VJFET to be used to make the first embodiment of the monolithically integrated cascode switch.

FIG. 3A illustrates the schematic cross-section views of the partially fabricated SiC VJFET to be used to make the first embodiment of the monolithically integrated cascode switch, prior to Si MOSFET fabrication on its top surface. The heavily doped n-type substrate 218 is not yet thinned down to the final thickness for easier wafer handling. The trenches are filled with dielectric 304, such as $SiO_2$, deposited using methods such as high density plasma (HDP) chemical vapor deposition (CVD). The dielectric 304 surface is planarized using methods such as chemical-mechanical polishing, so that Si MOSFET can be fabricated on top using either the first method or the second method. In the case of the first method, the $SiO_2$ layer 304 is also activated by plasma treatment for oxide-oxide bonding.

Figure 3B:
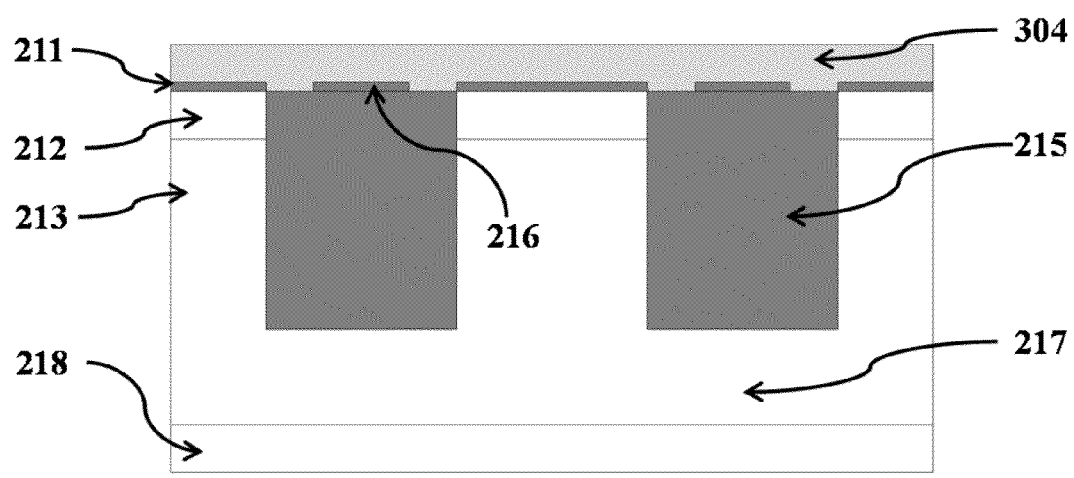
FIG. 3B illustrates the schematic cross-section views of the partially fabricated SiC VJFET to be used to make the second embodiment of the monolithically integrated cascode switch.

FIG. 3B illustrates the schematic cross-section views of the partially fabricated SiC VJFET to be used to make the second embodiment of the monolithically integrated cascode switch, prior to Si MOSFET fabrication on its top. The heavily doped n-type substrate 218 is not yet thinned down to the final thickness for easier wafer handling. The dielectric 304 surface is planarized using methods such as chemical-mechanical polishing, so that Si MOSFET can be fabricated on top using either the first method or the second method. In the case of the first method, the $SiO_2$ layer 304 is also activated by plasma treatment for oxide-oxide bonding.

Figure 3C:
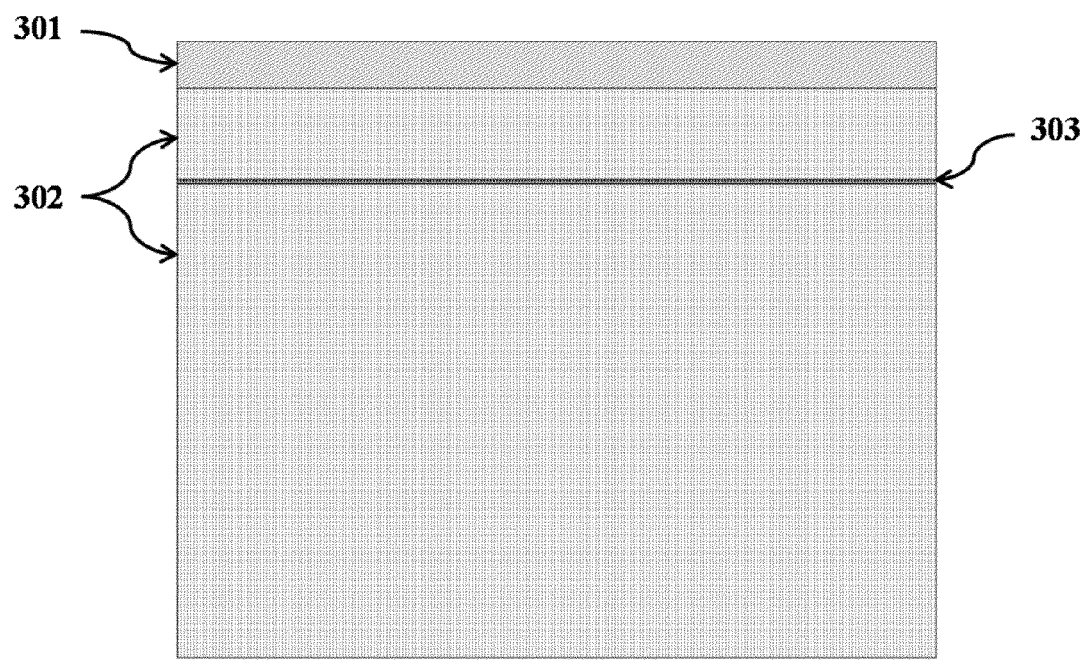
FIG. 3C illustrates the schematic cross-section views of the Si wafer to be used to make either the first or the second embodiment of the monolithically integrated cascode switch using the first method.

FIG. 3C illustrates the schematic cross-section views of the Si wafer 302 of n type to be used to make either the first or the second embodiment of the monolithically integrated cascode switch using the first method, i.e. the wafer bonding method. The Si wafer 302 is prepared for Smart Cut by implantation of a layer of protons 303 at the desired depth. A $SiO_2$ layer 301 of 1000 A is grown on top of the silicon wafer 302 for later oxide-to-oxide bonding to the SiC VJFET wafer.

Figure 4A:
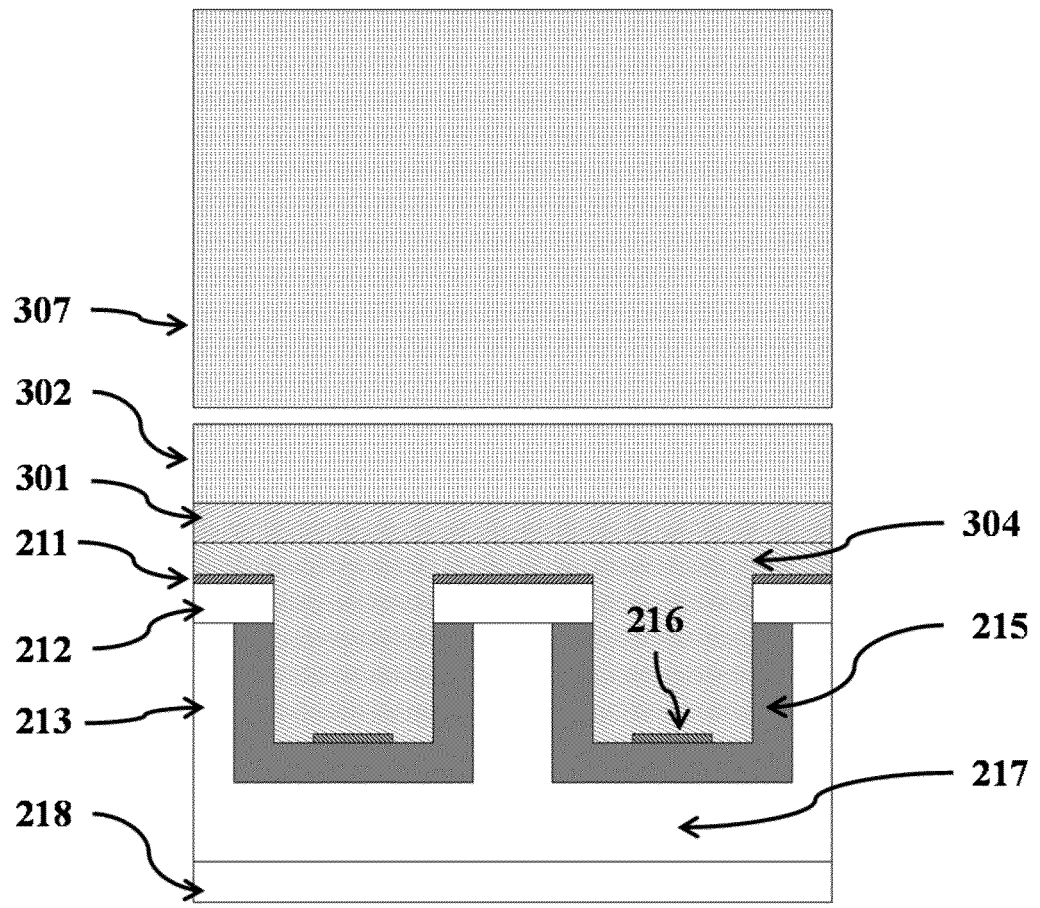
FIG. 4A illustrates the schematic cross-section views of the bonding process of the Si wafer and the SiC VJFET wafer, the wafer for making the first embodiment, using the first method.
Figure 4B:
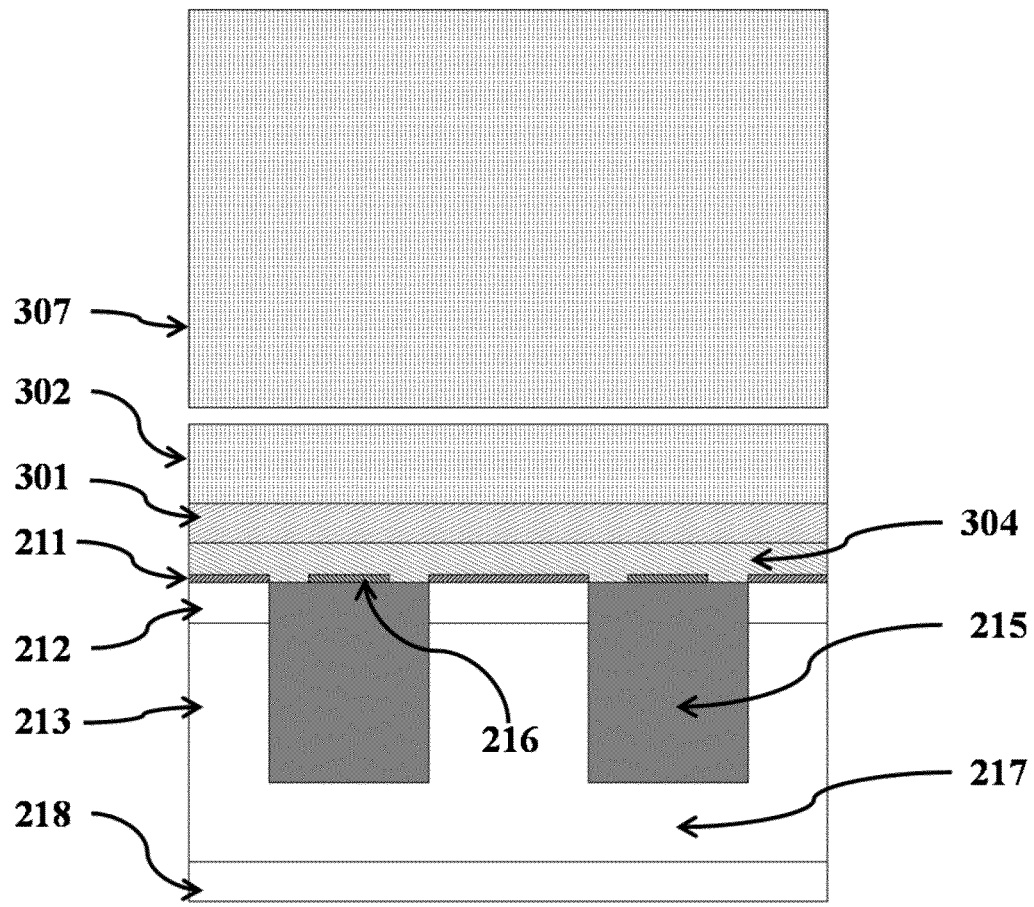
FIG. 4B illustrates the schematic cross-section views of the bonding process of the Si wafer and the SiC VJFET wafer, the wafer for making the second embodiment, using the first method.

FIGS. 4A and 4B illustrate the schematic cross-section views of the bonding process of the Si wafers 302 and the SiC VJFET wafers, the wafers for making the first and the second embodiments respectively, using the first method. The silicon wafer 302 is flipped and bonded to the SiC wafer, followed by removing the bulk of the silicon wafer 307 using the technique known as Smart Cut. The Si layer 302 that remains on top of the $SiO_2$ layer 301 will be used for fabricating the Si MOSFET after the wafer bonding process. The oxide-oxide bonding is typically accomplished at 400° C. with plasma activation, but temperature up to 800-900° C. can also be used in this step. After oxide-oxide bonding the oxide layer 301 on the Si wafer and the oxide layer 304 on the SiC wafer merge into one layer, and is denoted as a single $SiO_2$ layer 214 in FIGS. 2A and 2B.

Figure 5A:
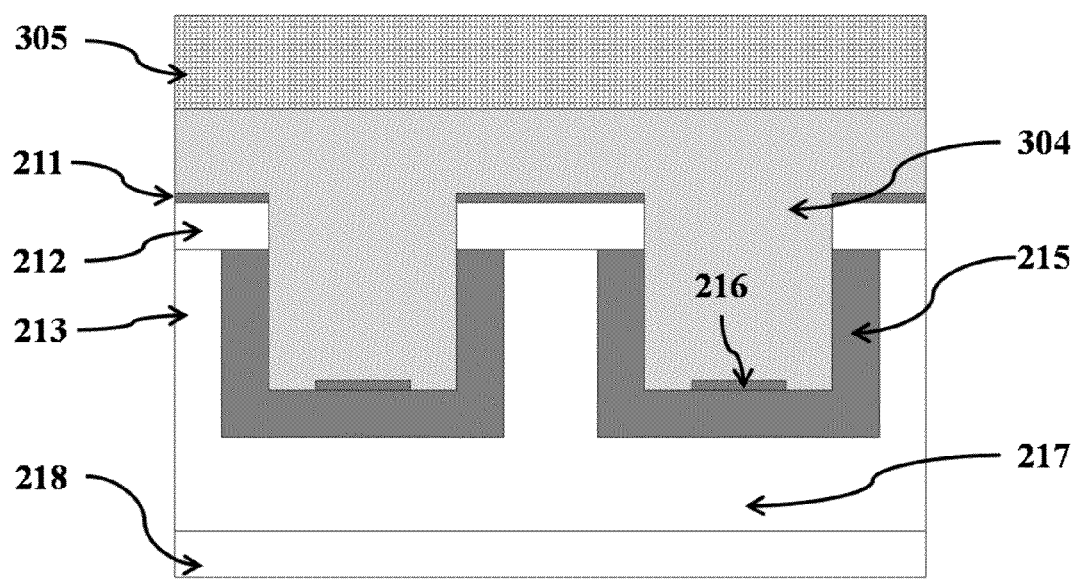
FIG. 5A illustrates the schematic cross-section views of the SiC VJFET wafer with polysilicon deposited on top of the dielectric layer for making the first embodiment, using the second method.
Figure 5B:
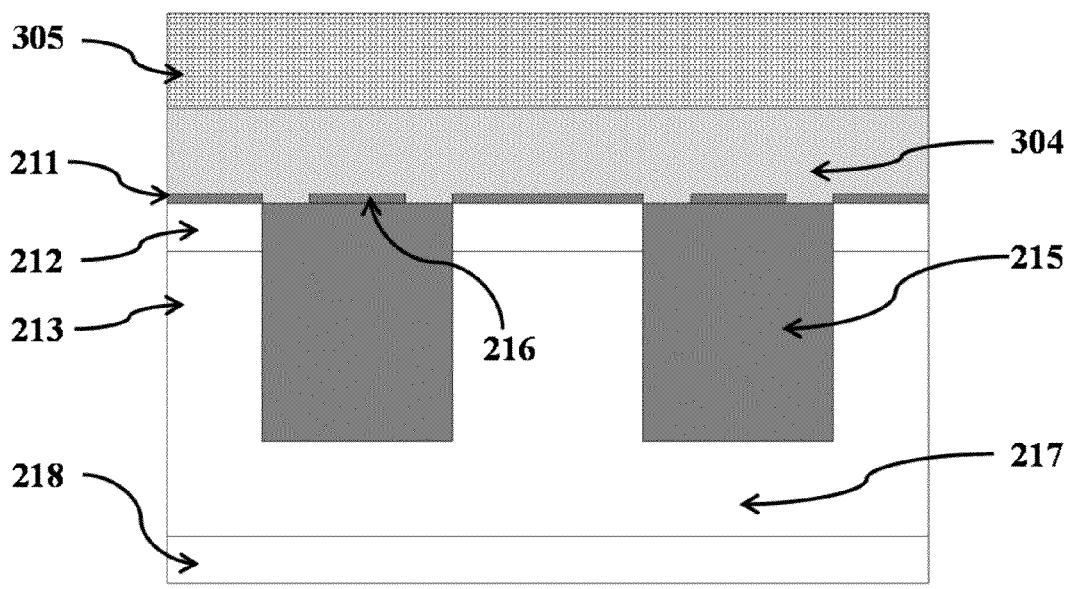
FIG. 5B illustrates the schematic cross-section views of the SiC VJFET wafer with polysilicon deposited on top of the dielectric layer for making the second embodiment, using the second method.
Figure 5C:
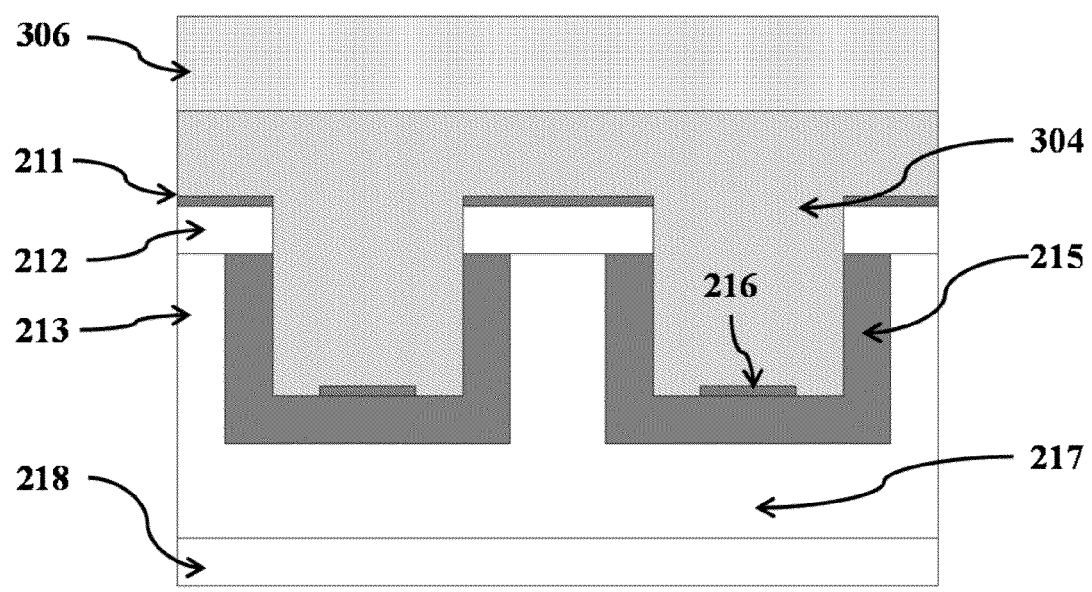
FIG. 5C illustrates the schematic cross-section views of the SiC VJFET wafer with recrystallized silicon on top of the dielectric layer for making the first embodiment, using the second method.
Figure 5D:
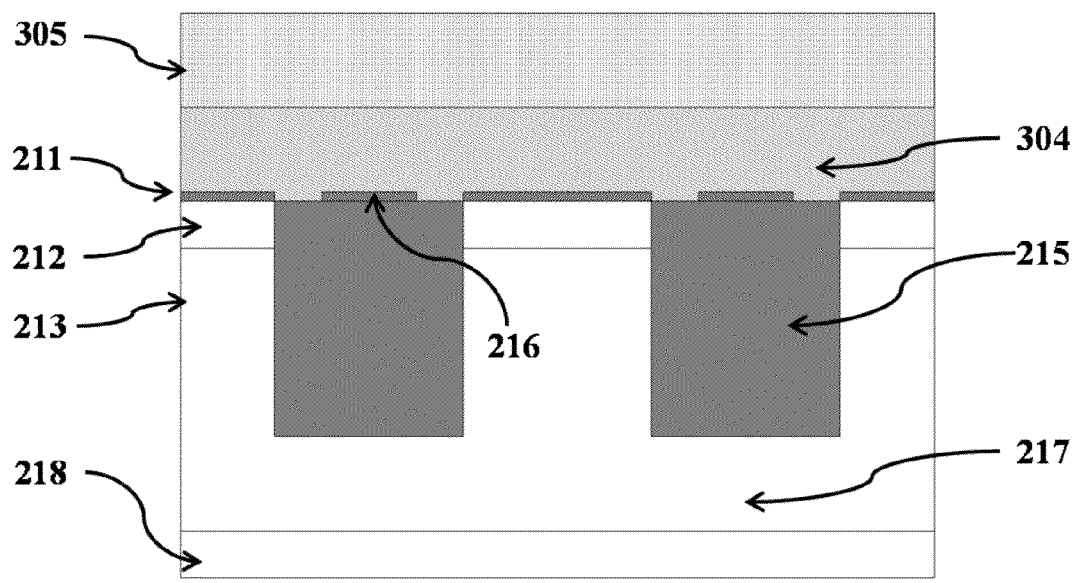
FIG. 5D illustrates the schematic cross-section views of the SiC VJFET wafer with recrystallized silicon on top of the dielectric layer for making the second embodiment, using the second method.

FIGS. 5A and 5B illustrate the schematic cross-section views of the SiC VJFET wafers with polysilicon layers 305 deposited on top of the dielectric layers 304 for making the first and the second embodiments respectively, using the second method. After deposition, the polysilicon 305 is melted and recrystallized by being heated with a nanosecond pulsed laser. As a result, the grains in the polysilicon are enlarged and the mobility is improved. FIGS. 5C and 5D illustrate the schematic cross-section views of the SiC VJFET wafers with recrystallized silicon 306 on top of the dielectric layers 304. The oxide layer 304 on the SiC wafer is the same as the $SiO_2$ layer 214 in FIGS. 2A and 2B. The recrystallized Si layer 306 will be used for fabricating the Si MOSFET in the following steps.

Both the first and the second method result in a silicon-on-insulator (SOI) on which the Si MOSFET is subsequently fabricated. The Si MOSFETs built on SOI structures are known to have multiple advantages over the Si MOSFETs built on bulk Si. One of such advantage is the reduction of off-state leakage current and consequently the capability to operate at higher temperature. This feature boosts the overall high-temperature operating capability of cascode switch which is limited by the Si MOSFET due to the fact that Si is only able to operate at lower temperatures than SiC due to its smaller band-gap.

Figure 6A:
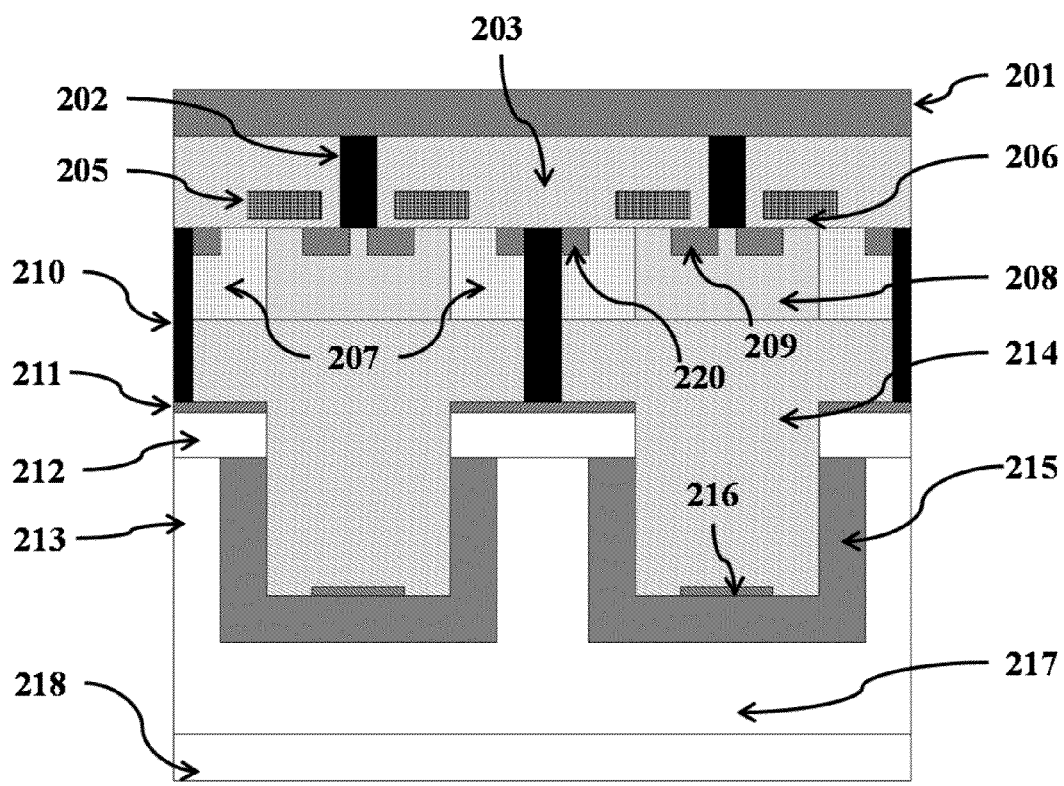
FIG. 6A illustrates the schematic cross-section views of the integrated cascode switch of the first embodiment after fabrication of the silicon MOSFET.
Figure 6B:
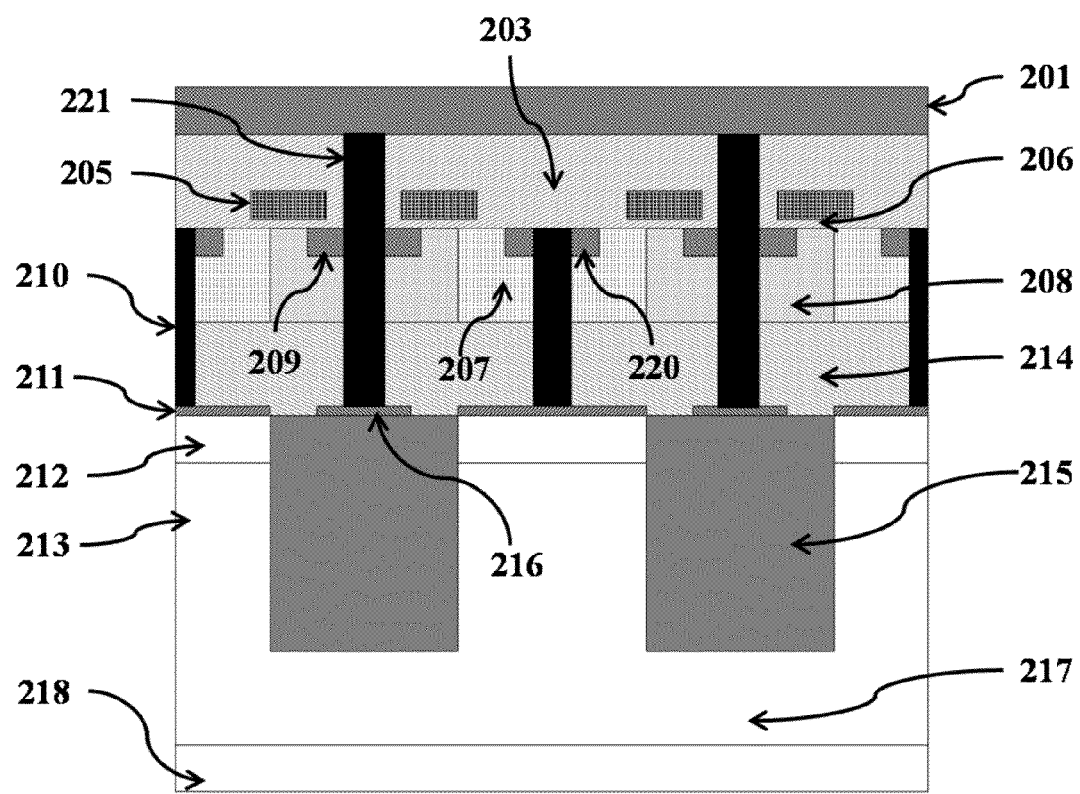
FIG. 6B illustrates the schematic cross-section views of the integrated cascode switch of the second embodiment after fabrication of the silicon MOSFET.

FIGS. 6A and 6B illustrates the schematic cross-section views of the integrated cascode switches of the first and second embodiments respectively, after the fabrication of the silicon MOSFETs using either the first or the second method. The Si MOSFET is fabricated on the using the Si layer that has been formed on top of the dielectric layer 214 using either the first method, i.e. wafer bonding, or the second method, i.e. recrystallizing polysilicon. The fabrication steps of the Si MOSFET include implantation or diffusion processes for forming of the body region 208 of p type, as well as the source region 209 and the drain region 220 of heavily doped n type. The Si surface is then oxidized followed by the formation of polysilicon gate. Subsequently tungsten via 210 is formed to connect the source 211 of the VJFETs and the drain 220 of the Si MOSFETs. The interlayer dielectric 203 is then deposited. Next, in the first embodiment, as shown in FIG. 6A, the tungsten via 202 is formed to connect the source contact 201 and the source region 209 of the Si MOSFET. A separate deep via is formed outside the cell to short the source of the Si MOSFET and the gate of the SiC VJFET, in the case of the first embodiment. In the second embodiment, as shown in FIG. 6B, the tungsten via 221 extends through the Si MOSFET stops on the gate contact 216 of the SiC VJFET, shorting the source overlay metal 201 of the Si MOSFET, with the source region 209 of the Si MOSFET, and the gate contact 216 of the SiC VJFET. The fabrication process of the Si MOSFET is completed by forming source overlay metal 201 on top of the interlayer dielectric 203. The process temperatures for fabrication of the Si MOSFET, including gate oxidation, needs to be below 800-900° C., and as a result should not alter or degrade the SiC VJFET. After completing the fabrication processes of the Si MOSFET, the SiC substrate 218 is ground to its final thickness. The thinning of the substrate 218 reduces both the electrical and thermal resistance from the substrate 218. After grinding, the backside drain contact 219, as shown in FIGS. 2A and 2B, can be formed using laser processes that have been widely used for making backside contacts to SiC wafers. The monolithically integrated cascode switch is then formed.

When ranges are used herein for physical properties, such as molecular weight, or chemical properties, such as chemical formulae, all combinations, and subcombinations of ranges for specific embodiments therein are intended to be included.

The disclosures of each patent, patent application, and publication cited or described in this document are hereby incorporated herein by reference, in its entirety.

Those skilled in the art will appreciate that numerous changes and modifications can be made to the preferred embodiments of the invention and that such changes and modifications can be made without departing from the spirit of the invention. It is, therefore, intended that the appended claims cover all such equivalent variations as fall within the true spirit and scope of the invention.

What is claimed:

1. An integrated cascode device, comprising: a junction gate field-effect transistor (JFET), the JFET comprising: a JFET drain contact extending along a first plane, the first plane extending along a first direction, a JFET gate contact extending along the first plane, the JFET gate disposed above the JFET drain contact along a second direction, the second direction being perpendicular to the first direction, a JFET source contact disposed above the JFET drain contact along the second direction, the JFET source extending along the first plane; a metal-oxide-semiconductor (MOS), the MOS comprising: a MOS drain contact extending along the first plane, the MOS drain contact disposed above the JFET source contact along the second direction, and a MOS source contact extending along the first plane, the MOS source contact disposed above the MOS drain contact along the second direction; and a first conductive via, the entirety of the conductive via having a first common centerline extending in the second direction, the conductive via electrically connecting the JFET source contact to the MOS drain contact.

2. The integrated cascode device of claim 1, further comprising a second conductive via, the entirety of the second conductive via having a second common centerline extending in the second direction, the conductive via electrically connecting the JFET gate contact to the MOS source contact.

3. The integrated cascode device of claim 2, wherein the first conductive via and the second conductive via are located in a common JFET cell.

4. The integrated cascode device of claim 2, wherein the first conductive via is located in a first JFET cell and the first JFET cell is devoid of another conductive via.

5. The integrated cascode device of claim 1, wherein the JFET gate contact and the JFET source contact are located the same distance above the JFET drain contact along the first direction.

6. The integrated cascode device of claim 1, wherein the JFET gate contact is located in between the JFET source contact and the JFET drain contact along the second direction.

7. A method of manufacturing an integrated cascode device, the method comprising:
  forming a junction gate field-effect transistor (JFET), the JFET comprising a JFET drain contact, a JFET gate contact and a JFET source contact, each of which extending along a first plane, the first plane extending along a first direction,
  forming a metal-oxide-semiconductor field effect transistor (MOSFET), the MOSFET comprising a drain contact and a source contact, each of which extends along the first plane,
  forming a monolithic JFET and MOS device by affixing the JFET to the MOS such that:
    the JFET gate contact is disposed above the JFET drain contact along a second direction, the second direction being perpendicular to the first direction,
    the JFET source contact is disposed above the JFET drain contact along the second direction, the JFET source extending along the first plane,
    the MOS drain contact extends along the first plane, the MOS drain contact being disposed above the JFET source contact along the second direction, and
    the MOS source contact extending along the first plane, the MOS source contact being disposed above the MOS drain contact; and
  forming a first conductive via in the monolithic device, wherein the entirety of the conductive via has a first common centerline extending in the second direction, the conductive via electrically connecting the JFET source contact to the MOS drain contact.

8. The method of claim 7, wherein the JFET further comprises a first oxide layer extending along the first plane,
wherein the MOS further comprises a second oxide layer extending along the first plane, and
wherein affixing the JFET to the MOS comprises bonding the first oxide layer to the second oxide layer.

9. The method of claim 7, wherein the JFET further comprises a first oxide layer extending along the first plane,
wherein prior to the step of forming a monolithic JFET and MOS device, depositing a polysilicon film on the first oxide layer, and
wherein affixing the JFET to the MOS comprises melting and then recrystallizing the polysilicon via a laser.

10. The method of claim 7, further comprising: forming a second conductive via, wherein the entirety of the second conductive via has a second common centerline extending in the second direction, the conductive via electrically connecting the JFET gate contact to the MOS source contact.

11. The method of claim 10, wherein the first conductive via and the second conductive via are formed in a common JFET cell.

12. The method of claim 10, wherein the first conductive via is located in a first JFET cell and the first JFET cell is devoid of another conductive via.

13. The method of claim 7, wherein the JFET gate contact and the JFET source contact are located the same distance above the JFET drain contact along the second direction.

14. The method of claim 7, wherein the JFET gate contact is located in between the JFET source contact and the JFET drain contact along the second direction.

15. A high-voltage switch comprising the integrated cascode device of claim 1.

16. A system comprising the high-voltage switch of claim 15.

* * * * *